United States Patent
Wagener

(10) Patent No.: US 7,235,495 B2
(45) Date of Patent: Jun. 26, 2007

(54) CONTROLLED GROWTH OF HIGHLY UNIFORM, OXIDE LAYERS, ESPECIALLY ULTRATHIN LAYERS

(75) Inventor: Thomas J. Wagener, Shorewood, MN (US)

(73) Assignee: FSI International, Inc., Chaska, MN (US)

( * ) Notice: Subject to any disclaimer, the term of this patent is extended or adjusted under 35 U.S.C. 154(b) by 4 days.

(21) Appl. No.: 10/900,912

(22) Filed: Jul. 28, 2004

(65) Prior Publication Data

US 2005/0048800 A1 Mar. 3, 2005

Related U.S. Application Data

(60) Provisional application No. 60/491,850, filed on Jul. 31, 2003.

(51) Int. Cl.
*H01L 21/302* (2006.01)
*H01L 21/461* (2006.01)
(52) U.S. Cl. .............. 438/756; 438/745; 438/753; 438/758; 257/E21.221
(58) Field of Classification Search ............ 438/758, 438/756
See application file for complete search history.

(56) References Cited

U.S. PATENT DOCUMENTS

| | | |
|---|---|---|
| 2,950,725 A | 8/1960 | Jacke et al. |
| 4,836,684 A | 6/1989 | Javorik et al. |
| 4,869,278 A | 9/1989 | Bran |
| 4,998,549 A | 3/1991 | Bran |
| 5,017,236 A | 5/1991 | Moxness et al. |
| 5,037,481 A | 8/1991 | Bran |
| 5,271,774 A | 12/1993 | Leenaars et al. |
| 5,365,960 A | 11/1994 | Bran |
| 5,382,296 A | 1/1995 | Anttila |
| 5,489,557 A | 2/1996 | Jolley |
| 5,534,076 A | 7/1996 | Bran |

(Continued)

FOREIGN PATENT DOCUMENTS

DE 4122561 1/1993

(Continued)

OTHER PUBLICATIONS

Wolf et al., "Silicon Processing for the VLSI Era," vol. 2—Process Integration, Lattice Press, pp. 298-367, 1990.

(Continued)

*Primary Examiner*—Michael Lebentritt
*Assistant Examiner*—Angel Roman
(74) *Attorney, Agent, or Firm*—Kagan Binder, PLLC

(57) ABSTRACT

The present invention relates to methods of making oxide layers, preferably ultrathin oxide layers, with a high level of uniformity. One such method includes the steps of forming a substantially saturated or saturated oxide layer directly or indirectly on a semiconductor surface of a semiconductor substrate, and etchingly reducing the thickness of the substantially saturated or saturated oxide layer by an amount such that the etched oxide layer has a thickness less than the substantially saturated or saturated oxide layer. In certain embodiments, methods of the present invention provide etched oxide layers with a uniformity of less than about +/−10%. The present invention also relates to microelectronic devices including made by methods of the present invention and manufacturing systems for carrying out methods of the present invention.

17 Claims, 4 Drawing Sheets

U.S. PATENT DOCUMENTS

| | | | |
|---|---|---|---|
| 5,571,337 | A | 11/1996 | Mohindra et al. |
| 5,681,396 | A | 10/1997 | Madanshetty |
| 5,715,851 | A | 2/1998 | Jung et al. |
| 5,834,871 | A | 11/1998 | Puskas |
| 5,849,091 | A | 12/1998 | Skrovan et al. |
| 5,868,882 | A | 2/1999 | Kern, Jr. et al. |
| 5,876,507 | A | 3/1999 | Bajkowski et al. |
| 5,908,509 | A | 6/1999 | Olesen et al. |
| 5,911,232 | A | 6/1999 | Mokuo et al. |
| 5,950,645 | A | 9/1999 | Olesen et al. |
| 6,006,765 | A | 12/1999 | Skrovan et al. |
| 6,048,405 | A | 4/2000 | Skrovan et al. |
| 6,158,445 | A | 12/2000 | Olesen et al. |
| 6,171,911 | B1* | 1/2001 | Yu ............................ 438/275 |
| 6,276,370 | B1 | 8/2001 | Fisch et al. |
| 6,300,202 | B1 | 10/2001 | Hobbs et al. |
| 6,311,702 | B1 | 11/2001 | Fishkin |
| 6,367,493 | B2 | 4/2002 | Schuler et al. |
| 6,444,592 | B1 | 9/2002 | Ballantine et al. |
| 6,492,283 | B2 | 12/2002 | Raaijmakers et al. |
| 6,531,364 | B1* | 3/2003 | Gardner et al. ............. 438/287 |
| 6,617,207 | B1 | 9/2003 | Kiryu et al. |
| 6,741,638 | B2 | 5/2004 | Ramberg et al. |
| 6,767,794 | B2* | 7/2004 | Gardner et al. ............. 438/287 |
| 7,135,417 | B2* | 11/2006 | Thakur ....................... 438/769 |
| 2001/0038662 | A1 | 11/2001 | Ramberg et al. |
| 2002/0056700 | A1 | 5/2002 | Ohmori |
| 2002/0096578 | A1 | 7/2002 | Al-Jiboory |
| 2002/0134402 | A1 | 9/2002 | Madanshetty |
| 2002/0171331 | A1 | 11/2002 | Puskas |
| 2003/0049942 | A1* | 3/2003 | Haukka et al. ............. 438/778 |
| 2003/0091410 | A1 | 5/2003 | Larson et al. |
| 2003/0188765 | A1 | 10/2003 | Chistenson et al. |
| 2004/0092133 | A1* | 5/2004 | Hyun et al. ................. 438/787 |
| 2004/0214398 | A1* | 10/2004 | Chen et al. ................. 438/275 |
| 2004/0235203 | A1* | 11/2004 | Gurba et al. ................... 438/8 |

FOREIGN PATENT DOCUMENTS

| | | |
|---|---|---|
| EP | 0396363 | 11/1990 |
| FR | 2580198 | 10/1986 |
| FR | 2762240 | 10/1998 |
| GB | 1456664 | 11/1976 |
| JP | 2001085422 | 3/2001 |
| WO | WO 00/68981 | 11/2000 |

OTHER PUBLICATIONS

Verhaverbeke, S. et al., "The Etching Mechanisms of $SiO_2$ in Hydrofluoric Acid," J. Electrochemical Soc., vol. 141, No. 10, pp. 2852-2857, 1994.

Knotter, D. Martin, "Etching Mechanism of Vitreous Silicon Dioxide in HF-Based Solutions," J. Am. Chem. Soc., vol. 122, No. 18, pp. 4345-4351, 2000.

Chambers, J.J. et al., "Effect of Composition and Post-Deposition Annealing on the Etch Rate of Hafnium and Zirconium Silicates in Dilute HF," Electrochemical Society Proceedings, vol. 2001-26, pp. 359-365, 2001.

Wallace, R.M. et al., "High-k Gate Dielectric Materials," MRS Bulletin, vol. 27, No. 3, pp. 192-197, 2002.

Schlom, D.G. et al., "A Thermodynamic Approach to Selecting Alternative Gate Dielectrics," MRS Bulletin, vol. 27, No. 3, pp. 198-204, 2002.

Wolf et al., "Properties and Chemical Vapor Deposition of Silicon Nitride," Silicon Processing for the VLSI Era, vol. 1—Process Technology, Lattice Press, pp. 191-194, 2000.

Fuchs, F. John, "Continuing Developments in Ultrasonic Technology," A2C2 Magazine, pp. 13-18, Sep. 2004.

Nakamura, K. et al., "Hydrofluoric acid etching of ultra thin silicon oxide film fabricated by high purity ozone," Thin Solid Films, pp. 361-364, Apr. 1999.

Wilk, G.D. et al., "Electrical Characteristics of High-Quality Sub-25- Å Oxides Grown, by Ultraviolet Ozone Exposure at Low Temperature," IEEE Electron Device Letters, vol. 20, No. 3, pp. 132-134, Mar. 1999.

Megasonic Transducer Report on Mikro Array, HKDE, Jun. 3, 2003 (2 pages).

Mikro Array, Sep. 16, 2003 (2 pages): Attachment "A" (translation) (1 page).

* cited by examiner

CONTROLLED GROWTH OF HIGHLY UNIFORM, OXIDE LAYERS, ESPECIALLY ULTRATHIN LAYERS

CROSS-REFERENCE TO RELATED APPLICATIONS

The present non-provisional Application claims the benefit of commonly owned provisional Application having Ser. No. 60/491,850, filed on Jul. 31, 2003, and entitled CONTROLLED GROWTH OF HIGHLY UNIFORM, OXIDE LAYERS, ESPECIALLY ULTRATHIN LAYERS, which Application is incorporated herein by reference in its entirety.

FIELD OF THE INVENTION

The present invention provides methodologies to precisely form ultrathin oxide layers having excellent uniformity and purity characteristics. The layers may be used in a wide range of applications, but are especially useful as buffer layers for higher k dielectric materials when making gate dielectric structures.

BACKGROUND OF THE INVENTION

Most integrated circuits currently produced are manufactured on thin disks of silicon and/or other semiconductor material (wafers) using "complementary metal oxide semiconductor" (CMOS) technology. A general discussion of CMOS technology can be found in "Silicon Processing for the VLSI Era, Volume 2—Process Integration" by Wolf et al., Lattice Press, 298-367, (1990). In a CMOS circuit, an electric potential applied to a transistor's gate electrode capacitively couples to its channel and controls the current that flows between its source and drain electrodes. The gate electrode is electrically insulated from the channel by the gate dielectric. The gate dielectric has historically utilized $SiO_2$ formed by thermally oxidizing the silicon above the channel. $SiO_2$ dielectrics have many advantages, including their ability to be removed by etching in either gas, plasma or liquid based processes.

The electrical properties of the transistor depend to a significant degree upon the nature of the gate dielectric. In particular, reducing the thickness of the dielectric increases the capacitive coupling between the gate and channel, allowing higher speed transistor operation at lower operating voltages. But, as the thickness of the dielectric is reduced much below about 20 angstroms, quantum tunneling effects tend to increase, allowing an electric current to flow between the gate and channel. This tunneling current is undesirable as it increases the transistor's power requirements and causes undue heat generation.

Excessive tunneling can be alleviated if the capacitive coupling between the gate and channel is increased by increasing the dielectric constant (k) of a fixed "physical" thickness of gate dielectric, $t_{phys}$. In one approach, then, a portion or all of a gate dielectric layer can be replaced with an equivalent "electrical thickness" of an insulating material having a dielectric constant that is higher than that of silicon dioxide. The equivalent "electrical thickness," $t_{elect}$, of a high-k gate dielectric is approximately equal to the gate's physical thickness times the ratio of the dielectric constants of $SiO_2$ and the high-k material, $k_{SiO2}$ and $k_{high-k}$, respectively. That is:

$$t_{elect} = t_{phys} * (k_{SiO2}/k_{high-k})$$

For example, assume it is desired to form a gate dielectric layer having the electrical capacitance of a silicon dioxide layer that is 10 angstroms thick. Because of quantum tunneling effects, actually using a silicon dioxide layer that is only ten angstroms thick is problematic. However, recognizing that silicon dioxide has a dielectric constant of 3.8, one generally instead can use 20 angstroms of a material whose dielectric constant is 7.6, or 30 angstrom of a material whose dielectric constant is 11.4, etc.

Developing higher k dielectric materials as well as effective methods of using them to make microelectronic devices has been extremely challenging. One challenge has been the quality of the interface between a semiconductor wafer substrate (especially silicon wafer substrates) and the higher k dielectric material. Whereas silicon dioxide tends to provide an excellent electrical interface with semiconductor materials such as silicon, higher k dielectric materials tend to provide a lesser quality interface. The poor quality of the interface tends to impair the electrical performance of the resultant microelectronic in those instances in which a higher k dielectric material is deposited directly onto the silicon.

It has been found by researchers that another dielectric material such as silicon dioxide or the like can provide a buffer, or bridge, between a semiconductor wafer and a high k dielectric material to improve electrical performance when using higher k dielectric materials. Generally, the buffer material is one that provides an electrical interface of a desired quality between the buffer and the semiconductor substrate, and the buffer in turn provides an electrical interface of a desired quality with the higher k dielectric material.

The buffer layer should not be too thick or else the benefits of using a higher k dielectric material may be unduly reduced. Accordingly, it would be desirable to use a very thin layer (typically on the order of about 20 angstroms or less, preferably about 15 angstroms or less, more preferably about 10 angstroms or less) of another suitable bridging dielectric material such as silicon dioxide as such a buffer. As a representative, concrete example, assume it is desired to use a dielectric layer having electrical capacitance comparable to a 10 angstrom thick silicon dioxide layer. Two angstroms, e.g., of silicon dioxide can be used as a buffer. This leaves 8 angstroms of equivalent silicon dioxide still to be made up. This may be provided by using one or more materials with higher dielectric constant(s) that provide an equivalent electrical thickness with respect to silicon dioxide of 8 angstroms. The resultant dielectric system will then be thick enough generally to avoid undue quantum tunneling problems while still providing some electrical capacitance characteristics as if it were 10 angstroms of silicon dioxide. Additionally, the intervening buffer layer helps to ensure that the electrical couplings between the substrate and the buffer, and then the buffer to the higher k material pass muster.

Of course, even though this example used a buffer layer having a thickness of 2 angstroms, other buffer thicknesses could be used depending upon factors such as the nature of the buffer material(s), the nature of the high k material(s), the desired electrical properties, thickness constraints, and the like. Thus, if the buffer layer were to be 6 angstroms thick, then only additional material that is the equivalent of 4 angstroms of silicon dioxide would need to be used to achieve the 10 angstrom standard used above as an illustration. Other standards, of course, may be used as well. Thus, one might desire to use a dielectric system that has the equivalent performance of 5 angstroms of silicon dioxide, or perhaps 15 angstroms of silicon dioxide, etc.

Unfortunately, it has been very difficult to fabricate extremely thin silicon dioxide layers (e.g., those having a thickness below about 10 angstroms) with desired uniformity characteristics. Lack of uniformity can impair electrical properties of the resultant devices. Thus, maintaining uniformity is very desirable, especially when manufacturing devices with smaller features such as those devices whose gate dielectric layers are comprised of silicon dioxide and/or other dielectric materials and having an equivalent thickness of about 20 angstroms or less, preferably about 15 angstroms or less, and more preferably, about 10 angstroms or less of silicon dioxide.

Thus, there is a strong need and desire in the industry to develop materials and/or methodologies that allow very thin, highly uniform dielectric layers to be formed with high precision.

SUMMARY OF THE INVENTION

As an overview, a substantially saturated, or saturated, oxide is chemically grown on a wafer, wherein the saturated thickness is greater than the desired thickness of the oxide. After the saturated oxide is formed, precision etching techniques are used to reduce the oxide thickness to the desired oxide thickness. The advantage of this approach is perhaps more appreciated in a concrete example. Assume that it is desired to form a silicon dioxide layer that is less than about 8 to 10 angstroms thick, e.g., less than a saturation oxide thickness when using desired oxide growing conditions and chemistry. Trying to form such an ultrathin layer directly, e.g., by growing the oxide and then trying to stop when growth reaches 6 angstroms, is difficult because too much thickness variation typically results. However, recognizing that saturated oxide is sufficiently uniform in thickness characteristics, and recognizing that precision, uniform etching of oxide is readily practiced to etch away angstroms, or fractions of angstroms, the present invention first grows an over-thick but uniform oxide layer by first forming a substantially saturated, or saturated oxide having a thickness on the order of 8 to 10 angstroms (which is typical for ozone or SC1 chemistry) and then uses precision etching techniques to etch back to the final desired thickness, e.g., 6 angstroms, or 5.5 angstroms, or 2 angstroms, etc. Such an approach allows very thin, highly uniform dielectric layers to be formed with high precision, e.g., a thickness uniformity that varies only by about +/−10%, more preferably about +/−5% when thickness is on the order of about 20 angstroms or less, preferably about 15 angstroms or less, more preferably about 10 angstroms or less. Meeting such uniformity standards becomes more difficult with decreasing layer thickness. For instance, a 20 angstrom layer with a uniformity of +/−5% can vary from 19 to 21 angstroms (a 2 angstrom range), but a 10 angstrom layer with a uniformity of +/−5% can vary only from 9.5 to 10.5 angstroms (1 angstrom range).

For purposes of illustration, the invention will be described in an illustrative context of using ultrathin (e.g., less than about 20 angstroms, preferably less than 15 angstroms, more preferably less than about 10 angstroms) dielectric layers that constitute all or a portion of gate dielectric features. However, it should be readily appreciated that the invention is applicable to the formation of oxide films of any thickness in a wide range of uses with respect to microelectronic devices in general. Other representative applications include any feature or structure in which use of a thin, uniform oxide layer is desired.

In one aspect of the present invention, a method of making an oxide layer, including the steps of forming a substantially saturated or saturated oxide layer directly or indirectly on a semiconductor surface of a semiconductor substrate, and etchingly reducing the thickness of the substantially saturated or saturated oxide layer by an amount such that the etched oxide layer has a thickness less than the substantially saturated or saturated oxide layer. In one preferred embodiment, the method further includes the step of depositing one or more high k dielectric material(s) directly or indirectly onto the etched oxide layer. In this one preferred aspect, the method can provide the gate dielectric layers of a gate dielectric component of a microelectronic device.

In another aspect of the present invention, a method of making a dielectric, buffer layer, including the step of forming a dielectric buffer layer directly or indirectly on a semiconductor surface of a semiconductor substrate, wherein the buffer layer has a thickness in the range of from about 0.5 angstroms to about 20 angstroms. Preferably, the method further includes the step of depositing one or more high k dielectric materials directly or indirectly onto the buffer layer. In this preferred aspect the method can provide the gate dielectric layers of a gate dielectric component of a microelectronic device.

In yet another aspect of the present invention, a microelectronic device including a gate dielectric layer formed directly or indirectly on a semiconductor surface of a semiconductor substrate, wherein the gate dielectric layer includes a buffer layer proximal to the substrate, the buffer layer having a thickness in the range of about 1 to about 10 angstroms and a uniformity of less than about +/−10%.

In yet another aspect of the present invention, a manufacturing system used in the course of manufacturing a microelectronic device, including at least one processing chamber in which one or more semiconductor substrates are subjected to oxidizing and etching treatments, and program instructions to form an oxide layer, the instructions including oxidizing instructions that cause oxidizing to occur in a manner effective to form a saturated oxide layer directly or indirectly on one or more semiconductor surfaces of one or more semiconductor substrates positioned in a processing chamber, and etching instructions that cause etching to occur in a manner effective to etchingly reduce the thickness of the saturated oxide layer.

In yet another aspect of the present invention, a method of making at least a portion of a gate dielectric layer, including the steps of: providing first information indicative of the thickness of a saturated or substantially saturated oxide layer; providing second information indicative of the etching characteristics of the saturated or substantially saturated oxide layer; and using the first and second information to formulate a process recipe for making at least a portion of the gate dielectric layer.

DETAILED DESCRIPTION OF THE INVENTION

Figure 1:
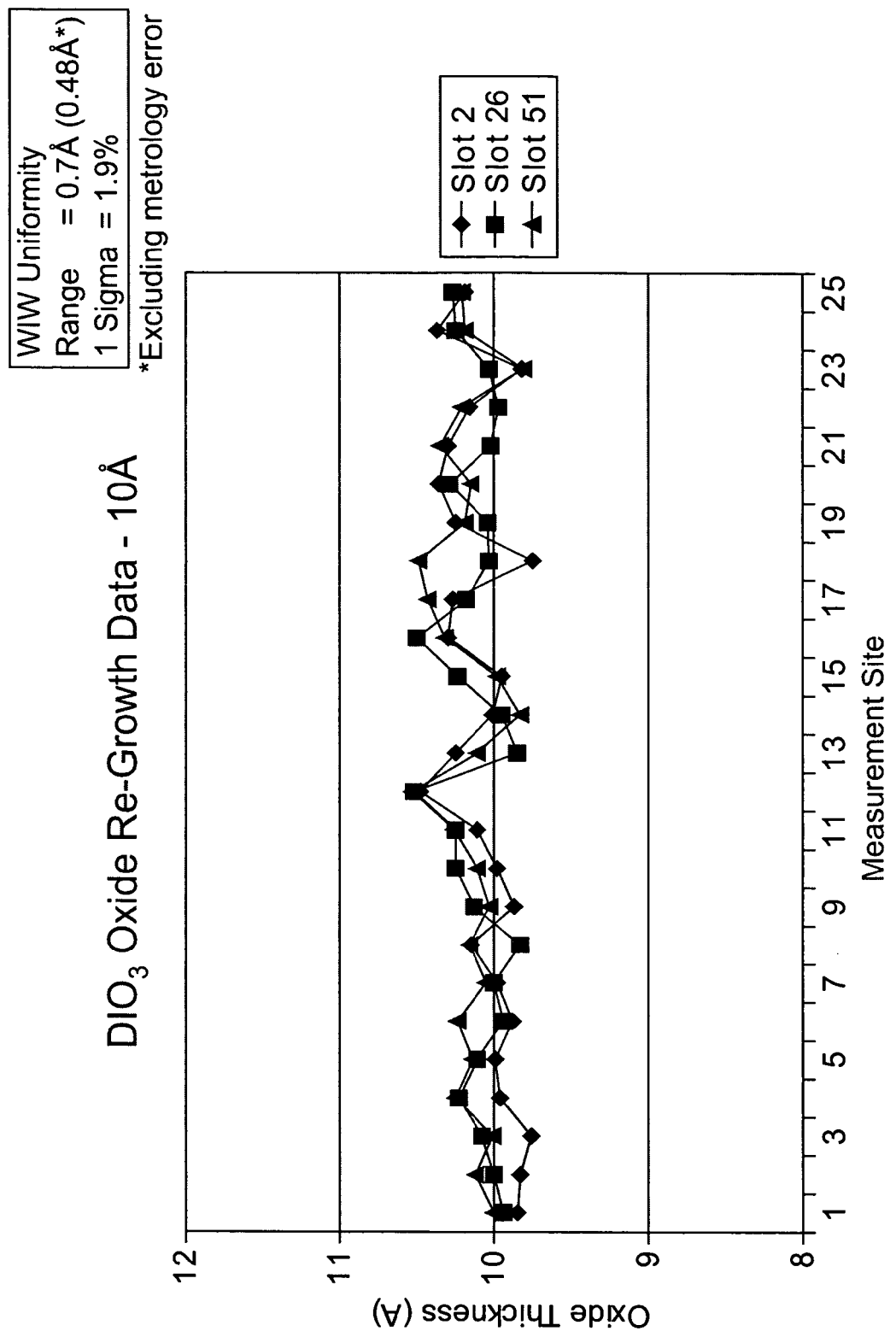
FIG. 1 shows a graph representing the uniformity of oxide thickness data for saturated oxide layers grown to nominally 10 angstroms with ozonated water ($DIO_3$).
Figure 2:
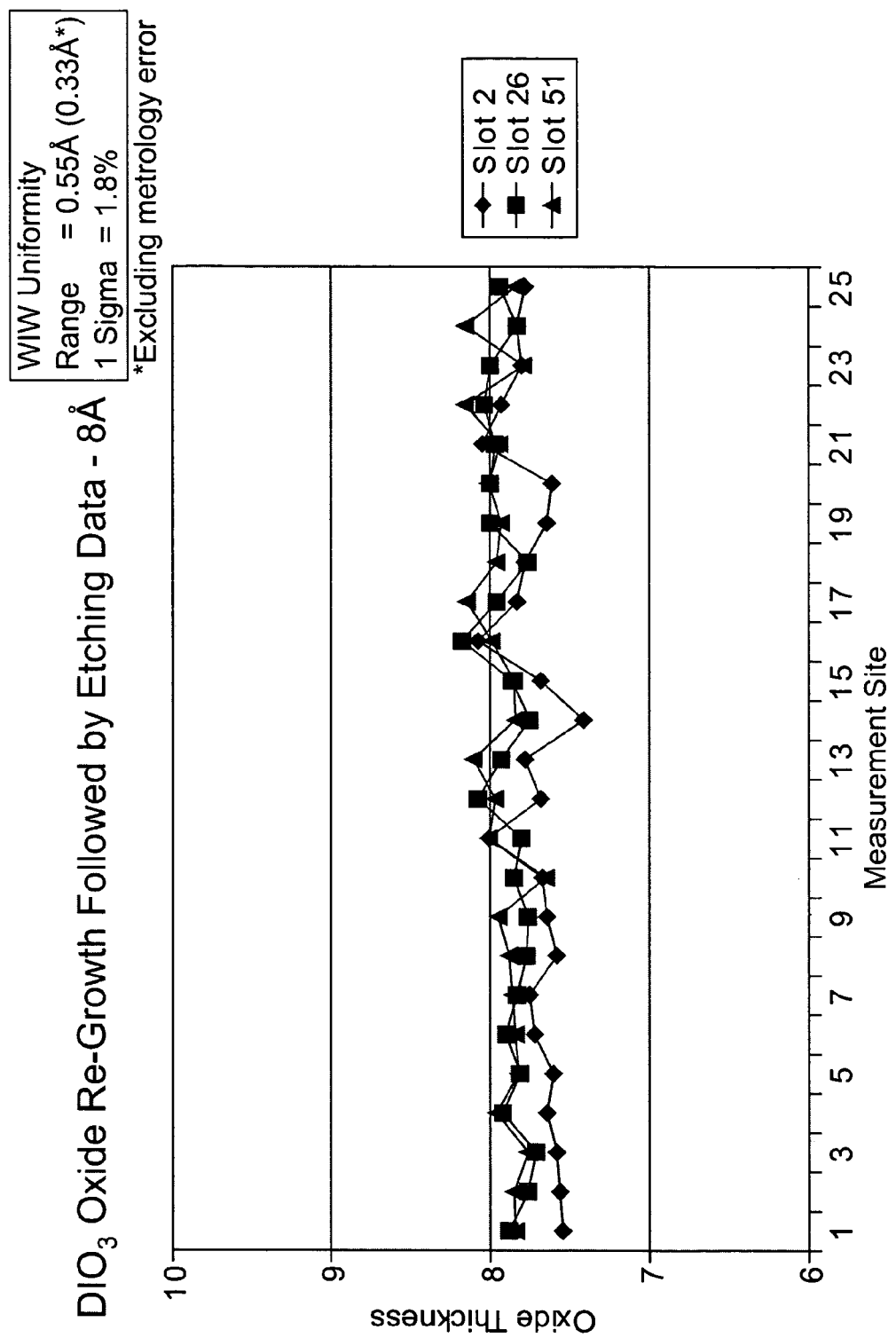
FIG. 2 shows a graph representing the uniformity of oxide thickness data after saturated oxide layers grown to nominally 10 angstroms have been etchingly reduced to nominally 8 angstroms with hydrofluoric acid chemistry.
Figure 3:
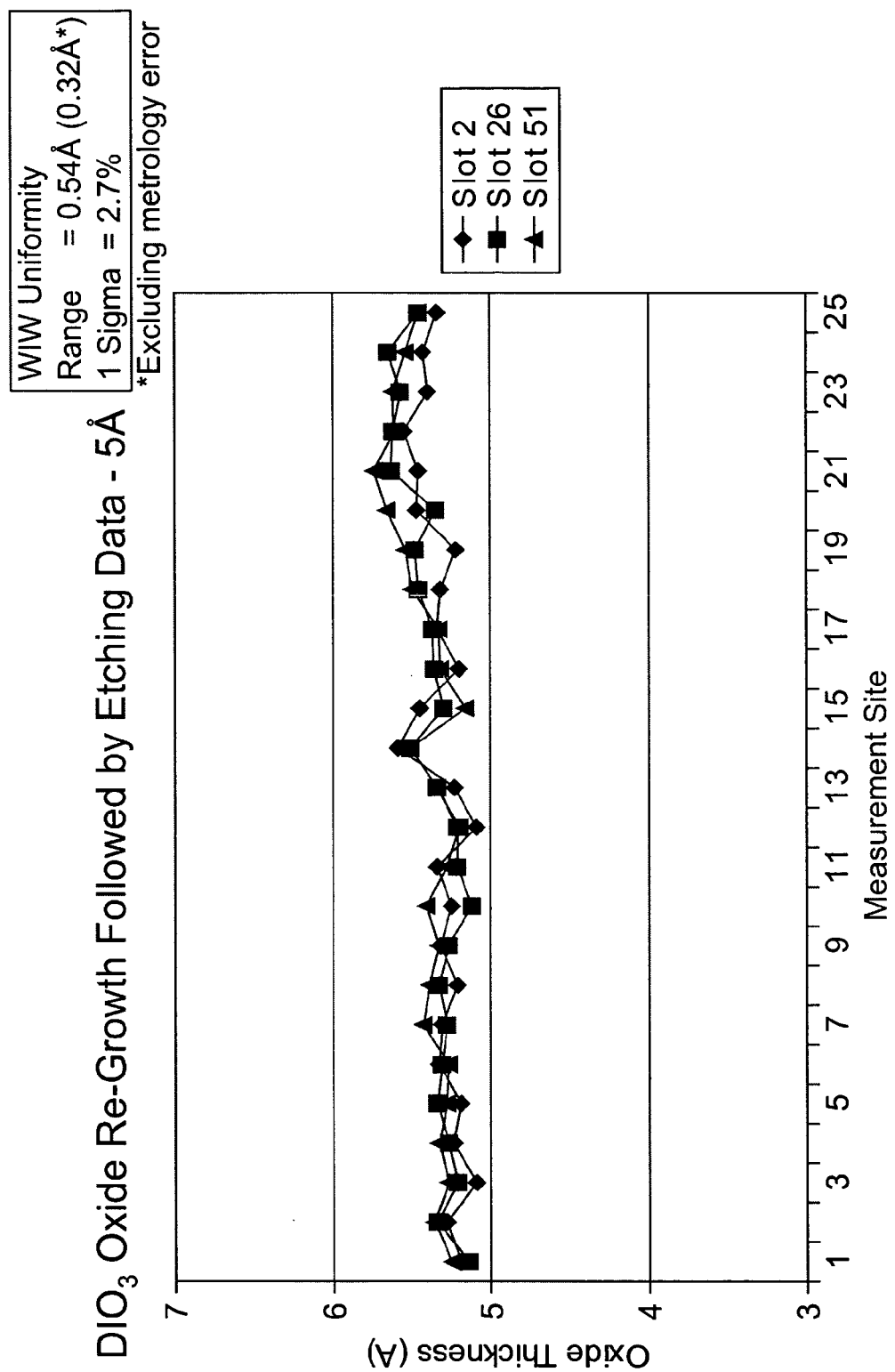
FIG. 3 shows a graph representing the uniformity of oxide thickness data after saturated oxide layers grown to nominally 10 angstroms have been etchingly reduced to nominally 5.5 angstroms with hydrofluoric acid chemistry.
Figure 4:
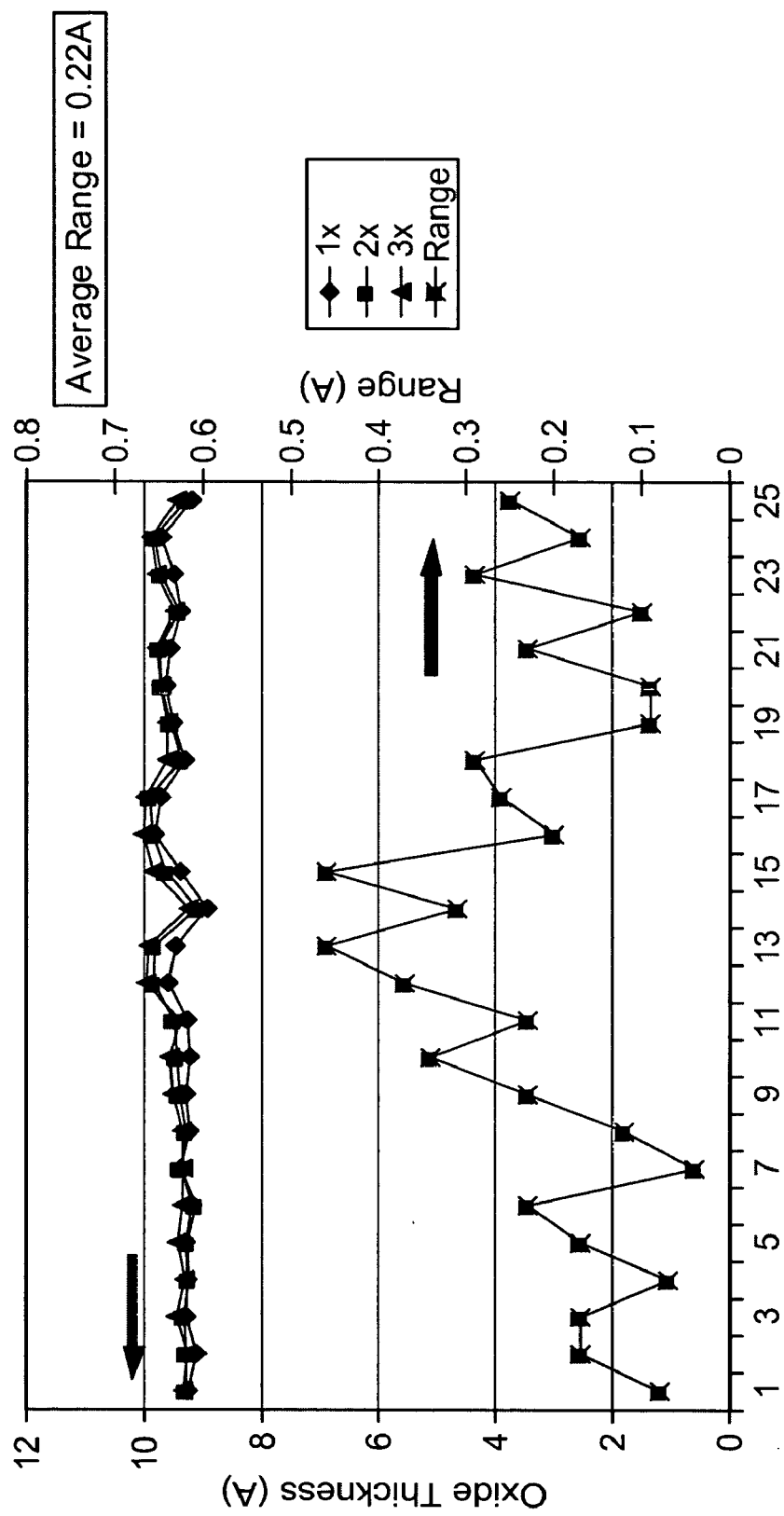
FIG. 4 shows a graph representing a metrology check for an oxide layer that is nominally 10 angstroms thick.

In the practice of the invention, layer thickness and uniformity are determined by the following procedures. All oxide thickness measurements were made on an ellipsometer, which measures the oxide thickness at 25 pre-determined locations across the wafer in accordance with program instructions provided with the instrument. In one protocol, a thickness measurement is made in the center of the wafer, another 16 symmetrically positioned points are measured proximal to the wafer perimeter, and an additional 8 symmetrically positioned points are measured on a "circle" about halfway between the center and the perimeter. The ellipsometer works by allowing light of known polarization to interact with a thin film structure. In general, the reflected light has a polarization different from the incident light. Knowing the polarization states of the light before and after reflection allows you to calculate film thickness and refractive index (given certain assumptions about the film structure). The thickness is given by the average of these 25 measurements. Sometimes it may be desirable to make two or more, preferably three, measurements at each point to help alleviate ellipsometer noise effects, and thickness at such a point is deemed to be the average of these measurements. Uniformity is calculated by taking the standard deviation of the 25 points (or the average of each point, if multiple measurements are made at each point) and dividing by the average of the 25 points. This value then is expressed as percent uniformity, 1 sigma.

There are different methodologies by which silicon dioxide forms on a silicon wafer substrate. A first approach is to form a so-called native oxide. When a silicon wafer having an exposed silicon surface is exposed to the ambient, the silicon surface will oxidize and form the native oxide. Native oxide formation is subject to saturation constraints. This means that the native oxide will grow only so thick, and then it will stop growing in thickness at saturation. Saturation thickness generally is independent of variables such as temperature and pressure, although these variables may affect the rate at which saturation is reached. Native oxide layer is saturated at about 6 to about 10 angstroms thick.

Native oxide generally is not a desirable constituent of microelectronic devices. Native oxide generally forms with contaminants embedded in it, and these contaminants disrupt the dielectric characteristics of the oxide. For instance, metal contaminants can make the native oxide more conductive. This, in turn, impairs the performance of resultant microelectronic devices. The contamination problem is more severe for smaller devices. For instance, a 10 angstrom thick layer of native oxide will have more impact on performance when it constitutes part of a 20 angstrom thick oxide layer (the native oxide is 50% of the total) than if the native oxide constitutes part of a 200 angstrom thick oxide layer (the native oxide is 5% of the total).

Consequently, microelectronic fabrication processes, especially those for smaller devices, tend to be carried out in way in which native oxide will not be a constituent of the resultant devices. Instead, oxide is formed under controlled conditions so that the dielectric properties of the oxide are not unduly compromised by contaminants. Most commonly, high quality oxide is grown thermally and/or chemically.

Thermally growing oxide involves heating a bare silicon surface in a furnace, bake station, or the like, in an appropriate, clean atmosphere. Although thin, uniform oxide layers are difficult to grow thermally, a furnace otherwise can be used to grow oxide layers of any desired thickness, up to about the thickness of the wafer being treated. A furnace typically is operated at a temperature of about 800° C. to 1200° C. Prior to heating, a cleaning process may be used that includes a strip with hydrofluoric acid or the like followed by rinsing in deionized water and drying. The thickness of the oxide layer is affected by factors including the temperature, time, and oxygen content in the furnace. Oxide films may be grown up to 1000 angstrom in thickness, or more, within a short period of time. Thus, variations in the furnace exposure time of only a few seconds can cause the thickness oxide layer to vary widely. Additionally, the length of time the wafer waits between cleaning and being placed in the furnace affects the thickness of the oxide film, since native oxide film grows naturally in air.

Chemically growing oxide involves contacting a bare silicon surface with liquid and/or gaseous chemical(s) that oxidize the surface. These processes often are carried out at temperatures below about 100° C., even at room temperature or cooler. Chemically growing oxide is subject to saturation constraints. Whereas a furnace can be used to oxidize the entirety of a wafer substrate, chemically grown oxide grows to a saturation point after which further oxidation does not occur or else occurs so slowly as not to occur as a practical matter. For many oxidizing chemistries, about 10 angstroms is a typical saturation thickness when oxidizing bare silicon. Temperature, pressure, concentration, etc. may impact the rate at which saturation is reached, but otherwise do not substantially alter, if at all, the thickness at which saturation is reached. In short, the oxide growth has reached saturation when practically no more oxide thickness will grow under the reaction conditions.

The well-known SC1 chemistry, including dilute and ultradilute embodiments thereof, may be used to chemically grow oxide. SC1 chemistry typically involves using an aqueous solution of hydrogen peroxide and ammonia. A wide range of recipes may be used including those that are relatively concentrated (such as 5 parts by weight water, 1 part by weight aqueous ammonia, and 1 part by weight of peroxide), moderately dilute (e.g., up to about 100 to 500 parts by weight of water per part by weight of ammonia and peroxide), or very dilute (more than 500 parts by weight water per part by weight of ammonia and peroxide). The chemistry most commonly is practiced in wet benches or spray processors, but gas phase processing may be practiced. SC1 chemistry has at least three drawbacks. First, the ammonia and/or peroxide tend to have metal contaminants that end up in the oxide. Second, growth of the oxide is nonuniform until saturation is reached. For instance, one may see a variation of +/−3 angstroms if one tries to stop the process at only 6 angstroms. Yet, the variation might only be +/−0.5 angstroms if the growth is allowed to proceed to saturation, which occurs at about 6 to about 10 angstroms. This is not problematic if one wants a 10 angstrom thick oxide, but is problematic if thinner oxide is desired. Third, SC1 chemistry is reactive with hydrofluoric acid (HF) chemistry and can form undesirable salts. Generally, this requires that HF processing and SC1 processing occur in different chambers unless cumbersome rinsing operations are interposed between the treatments. Multi-tank processing is not as desirable, in some instances, as single tank processing.

Using chemistry incorporating ozone (such as ozonated water and/or ozone gas) to grow oxide is an alternative to SC1 chemistry and is similar to SC1 chemistry in some respects. Like SC1 chemistry, ozone oxidation proceeds nonuniformly until saturation is reached. And, saturation is reached at about 10 angstroms. However, ozone chemistry tends to be cleaner than SC1 chemistry. Also, ozone decomposes rapidly to oxygen, and thus is more environmentally friendly to use than SC1. Further, ozone is not unduly reactive with HF, allowing HF and ozone treatments to be readily carried out in the same vessel.

In certain embodiment(s) of the present invention, a substantially saturated or saturated oxide layer is formed on a semiconductor surface under conditions such that the oxide layer has a thickness in the range of from about 8 angstroms to about 20 angstroms. Preferably, a substantially saturated or saturated oxide layer is formed on a semiconductor surface under conditions such that the oxide layer has a thickness in the range of from about 8 angstroms to about 11 angstroms.

A preferred mode of practice involves a sequence of treatments including an optional cleaning phase, an oxidation phase to form a substantially saturated, or saturated oxide layer, a precision etching phase, preferably removing less than about 20, more preferably less than about 10 angstroms of oxide to yield an etched oxide layer having a thickness of less than about 20 angstroms, preferably less than about 10 angstroms, more preferably 2 to 8 angstroms, and then an optional rinsing and drying phase. In certain embodiments of the present invention, the substantially saturated or saturated oxide layer is etchingly reduced by an amount in the range of from 0.5 angstrom to about 18 angstroms, preferably in the range of from 1 to 15 angstroms, and even more preferably in the range of from 1 to 9 angstroms. In certain embodiments of the present invention, the substantially saturated or saturated oxide layer is etchingly reduced by an amount such that the etched oxide layer has a thickness in the range of from about 0.5 to about 19 angstroms, preferably from about 0.5 to about 9 angstroms.

A wafer optionally first may be cleaned via a suitable process such as etching, rinsing, and drying to provide a wafer with an exposed semiconductor, e.g., silicon, surface. This cleaning may occur in one or more process tools such as a wet bench(es) such as the FSI MAGELLAN® tool, spray tool(s) such as the FSI MERCURY® or ZETA® tools, and/or gas phase processor(s) such as the FSI ORION® or EXCALIBUR® tools, all available from FSI International, Inc. Preferably, the entirety of cleaning occurs in the same tool at one or more stations to avoid exposing the wafer to the ambient.

In a preferred embodiment, cleaning occurs in a wet bench tool or spray processor using a recipe comprising one or more etchings steps and one or more rinsing steps. The objective of the etching treatment is to provide a wafer with clean, exposed, bare semiconductor material on which an oxide can be chemically grown.

The nature of how this etching treatment is carried out is not critical, and a wide range of conditions and chemistry may be used in accordance with conventional practices now or hereafter developed, keeping in mind the objective is to obtain a wafer with a clean, exposed, semiconductive surface such as bare silicon. In a preferred mode, this etching occurs using fluorine-containing etching compositions such as aqueous HF, aqueous buffered HF, and/or the like applied via a wet bench or spray processor tool.

The concentration of the HF may vary over a wide range. Generally, diluting one part by weight of, for instance, 49% by weight HF (which is widely available) with 1 to 10,000, preferably 10 to 500, more preferably about 200 parts by weight of deionized water would be suitable. Etching may occur over a wide temperature range depending upon whether the chemical to be used is a liquid or a gas. Using aqueous, liquid chemistry, temperatures of from about 5° C. to about 95° C. may be used, although etching at room temperature is effective, economical, and therefore preferred. In a typical wet bench operation, using a 10 to 100, preferably 20 to 40, LPM flow of 200:1 HF (49%) diluted with deionized water, at 20-25° C. (room temperature) for about 2 to 8, preferably about 4 minutes would be suitable. This etch may be carried out as an integrated transition rinse/etch/rinse process as described in assignee's copending application Ser. No. 10/115,449, filed Apr. 3, 2003, for TRANSITION FLOW TREATMENT PROCESS AND APPARATUS in the names of Kurt K. Christenson, Nam Pyo Lee, Gary William Michalko, and Christina Ann Rathman, the entirety of which is incorporated herein by reference. The transition etch is preferred because the methodology etches extremely uniformly and controllably. A commercial embodiment of the transition etch process is marketed under the trade designation SYMFLOW™ TECHNOLOGY by FSI International, Inc.

The chemistry of aqueous HF solutions and its etch mechanisms have been investigated by Verhaverbeke and Knotter (S. Verhaverbeke et al., "The Etching Mechanisms of $SiO_2$ in Hydrofluoric Acid," J. Electrochemical Soc., 141 (10), 2852-2852, (1994); D. Martin Knotter, "Etching Mechanisms of Vitreous Silicon Dioxide in HF-Based Solutions," J. Am. Chem. Soc., 122 (18), 4345-4351, (2000)). Verhaverbeke and Knotter noted that the concentration of the various ionic species in aqueous HF (e.g., HF, $HF_2^-$, $H_2F_2$, $H^+$, $F^-$) vary with HF concentration, ascribing the etching of $SiO_2$ to $HF_2^-$ and $H_2F_2$. Knotter (2001) further investigated the etching mechanisms of $Si_3N_4$ in aqueous HF.

U.S. Pat. No. 5,382,296 to Anttila notes that aqueous HF concentrations of 0.000049 wt % to 0.049 wt % can be used near ambient temperature to clean "particles . . . as well as metallic and organic contamination" where the equivalent thickness of the metallic film is approximately $10^{-6}$ A (Angstrom=$10^{-10}$ meter), far below one monolayer of film coverage. U.S. Pat. No. 6,300,202 to Hobbs notes that "metal oxide dielectrics are not readily susceptible to wet etch processing" and proposes removing the metal-oxides by first reducing the metal-oxides to metals by annealing in a low-oxygen or hydrogen-rich environment, followed by etching the metallic metals with a wet or dry etch.

In recently published work, Chambers tested the etching of unannealed and annealed films in ambient temperature, 0.49 wt % aqueous HF, and concluded that for annealed films "Selectivities of metal silicate to silicon dioxide of <0.1 were measured, indicating the need for alternative high-k wet etch chemistries with high selectivity to silicon dioxide and silicon" (J. J. Chambers et al., "Effect of Composition and Post-Deposition Annealing on the Etch Rate of Hafnium and Zirconium Silicates in Dilute HF," Proc. 7th Intl. Symp. on Cleaning Technology in Silicon Device Mfg., Electrochemical Society, Pennington, N.J., PV 2001-26, 359).

After etching, rinsing desirably occurs under conditions effective to at least substantially rinse away any residual HF (or other etchant) that otherwise might unduly react with the substrate surface during the next oxidation phase. Any rinsing conditions may be used to achieve this objective. As one example, one illustrative mode of rinsing in a wet bench involves 2 to 100, preferably 20 to 40 LPM flow of DI water, at a temperature from 5° C. to about 100° C., preferably 20 to 25° C. for 1 to 15, preferably 2 to 10, more preferably about 5 min. As noted above, rinsing may be integrated with etching in the transition rinse/etch/rinse methodology.

After rinsing, the substrate(s) optionally may be dried as described below, although it is more preferred to proceed directly with the oxidation treatment. The purpose of the oxidation phase is to carry out an oxidation using a chemistry or other conditions that are subject to a saturation constraint (unlike conventional thermal, furnace oxidation) for a time long enough for the substrate(s) to substantially reach, or reach, saturation. Extended time periods may be used to help ensure that saturation is reached. Thus, SC1 or ozone chemistries or the like may be used. This will provide an oxide with a thickness corresponding to about the saturation thickness, but that is greater than the desired final thickness. Typically, when using ozone or SC1 chemistries, or the like, the saturation thickness is about 10 angstroms, so use of SC1 or ozone chemistry is useful to form uniform oxide layers that can be etched back to have a resultant thickness after etching of less than about 10 angstroms. As used herein, "substantially reach saturation" means that oxidation is carried out long enough to reach a desired condition of oxide thickness uniformity, e.g., an oxide thickness in which the thickness uniformity is within +/−15%, preferably within +/−10%, more preferably within +/−5%. Since chemically grown oxides tend to grow non-uniformly until saturation, proceeding substantially to saturation, or at least to saturation, helps to promote the thickness uniformity of the grown oxide.

Because ozonated water tends to be cleaner than SC1 chemistry, using ozonated water is preferred to grow saturated oxide. In a representative mode of practice, it is preferred to use conditions involving a source of pressurized ozonated water having an ozone concentration of 10 to 90, preferably 60 to 80 ppm at 0° C. to 60° C., preferably 0° C. to 25° C., more preferably room temperature, at a flow of 5 to 100 LPM, more preferably about 20 to 40 LPM for 1 to 15, preferably about 5 to 10, more preferably 7 minutes. The pressurized system available from FSI is useful for accomplishing this. These conditions preferably proceed long enough to moderately exceed the time required to reach saturation so as to help ensure that saturation is reached. Doing so yields oxide with very good uniformity such as 10 angstroms +/−0.3 angstroms, which is an exceptionally minor variation in uniformity for oxide layers so thin!

Rinsing then occurs again to remove oxidizing chemical that might unduly react with the chemistry used to carry out the next etching phase.

With a saturated, uniform oxide layer now grown on the wafer, an etching chemistry that is able to controllably remove single digit angstrom (or fractions thereof) amounts of oxide, or otherwise as desired, is carried out. For instance, in some modes of practice, it may be desirable to form a 10 angstroms thick, saturated oxide, and then etch away 1 to 9.5 angstroms of such a layer to yield an etched oxide having a thickness of 9 to 0.5 angstroms. Any etching chemistry that offers this kind of precision may be used. As an example, using dilute, aqueous HF is one such chemistry that allows one to controllably remove oxide in the single digit angstrom regime.

The appropriate concentration of aqueous HF may be determined empirically in a variety of ways. As one approach, it is advantageous to define the etching duration first and then determining the concentration of etchant that accomplishes etching in approximately this time frame. If this time period is too short, process control is more difficult to implement. On the other hand, taking too much time just wastes fabrication time and lowers throughput efficiency. Balancing these concerns, suitable etching durations are in the range from about 20 seconds to 500 seconds, more preferably 50 seconds to 200 seconds. Once this time period is set, the concentration of HF needed to achieve the desired amount of oxide removal in about that time period may be determined. As examples, diluting 1 part of 49% HF with 800 parts of deionized water removed 2 angstroms of oxide in 45 seconds at room temperature, while diluting 1 part of 49% HF with 800 parts of deionized water removed 4 angstroms of oxide in 150 seconds at room temperature. Starting with a saturated oxide having a thickness of 10 angstroms +/−0.3 angstroms, the final thickness were 8 angstroms +/−0.3 angstroms and 5 angstroms +/−0.3 angstroms, respectively, as shown in the graphs included herewith. Remarkably, this data shows that precision etching removed angstrom quantities of oxide without reducing the uniformity of the oxide being etched, at least to within the precision of the metrology being used.

After precision etching, the substrate(s) may be rinsed and dried. Rinsing may be carried out as described above. Although any suitable drying conditions may be used, an excellent drying methodology is the STG® Process of FSI International, Inc. This treatment carries out drying in a controlled atmosphere in the presence of a cleaning enhancement substance such as isopropyl alcohol. The STG® drying treatment and other Marangoni style drying treatments are described in U.S. Pat. Nos. 5,571,337 and 5,271,774, the entireties of which are incorporated herein by reference.

Substrates may be processed singly or in batches, depending upon the nature of the tools used to carry out the processing. Processing may occur in multiple tools or in one or more stations of a single tool. For instance, an entire cleaning, oxidizing, etching, rinsing, and drying recipe of the present invention may be carried out in an FSI MAGELLAN® tool, commercially available from FSI International, Inc., Chaska, Minn. The substrate(s) advantageously are not exposed to the ambient when carrying out the processing in a single tool, or even a single processing chamber A wide range of high k dielectric materials are known. Early approaches to increasing k included "nitriding" the $SiO_2$, forming silicon oxy-nitrides ($SiO_xN_y$) of various stoichiometries. Recent work evaluating the electrical, metallurgical and chemical properties of various dielectric materials has focused upon the unary oxides of aluminum, zirconium and hafnium, mixtures of these oxides, and silicates of these elements or mixtures. A general discussion on the need for high-k dielectrics can be found in "High-k Gate Dielectric Materials," by R. M. Wallace et al., MRS Bulletin, 27 (3), 192-197, (2002). A general discussion on the selection process that leads to particular metal oxides can be found in "A Thermodynamic Approach to Selecting Alternative Gate Dielectrics," by D. G. Schlom, MRS Bulletin, 27 (3), 198-204, (2002).

In the practice of the present invention, a high-k dielectric material refers to a material having a dielectric constant, k, that is greater than the dielectric constant for $SiO_2$ (k=3.8).

Preferred high k materials comprise unary oxides (i.e., those oxides including predominantly, e.g., at least 95 to 100% of one elemental constituent other than oxygen) such as $HfO_2$. Other high k materials include those incorporating at least two elemental constituents in addition to optional oxygen. It has been discovered that dielectric materials comprising at least two elemental constituents in addition to any optional oxygen may be favorably etched using the dilute fluoride containing etching solutions of the present invention. While not wishing to be bound by theory, it is believed that the favorable etch characteristics are related to the crystalline structure of the high-k dielectric films. Conventionally, a unary high-k dielectric material, i.e., a material comprising only one elemental constituent other than oxygen (e.g., $HfO_2$ and $ZrO_2$), are highly resistant to dilute etchants. However, it is believed that incorporating at least two elemental constituents in addition to optional oxygen disrupts the crystalline lattice to a sufficient degree such that the material is more susceptible to etching.

$SiO_2$ is a convenient reference for identifying high-k dielectric materials, as $SiO_2$ is the current dominant gate dielectric material. Switching from essentially pure $SiO_2$ to a higher k dielectric material, which may or may not be intermixed or otherwise combined with conventional $SiO_2$, is desirable in order to reduce the equivalent electrical thickness needed for a particular application. Commonly, it may be desirable to reduce the equivalent electrical thickness by a factor of at least 2 or 3, which in turn would require high-k dielectric material having a dielectric constant that is at least 2 or 3 times greater than k=3.8. Accordingly, in the practice of the present invention, preferred high-k dielectric material(s) refers to those materials having a dielectric constant of at least about 7.6, and more preferably at least about 10.

A wide variety of dielectric materials may be used as high-k dielectric materials of the invention. In some embodiments, preferred high k dielectric materials comprise at least two constituents selected from Zr, Hf, Si, Ge, Y, As, N, and Al. In some embodiments, if the material comprises both Si and N, it is further preferred that such embodiments further comprise at least one additional constituent such as Zr, Hf, Ge, Y, As, combinations of these, or the like.

One class of high k dielectric materials found to be suitable in the practice of the present invention includes silicates such as those that generally have the formula $M_zSi_yO_x$, wherein M is one or more metals, y has a value such that the silicate comprises 10% to 90%, preferably 10% to 50% mole fraction Si compared to the other metal(s), and x and z are selected to satisfy stoichiometry. Such silicates optionally may also include one or more additional constituents, as desired, of which Y, As, Ge, N, Al, combinations of these, and the like are representative.

Specific examples of silicates include, e.g., $HfSiO_4$ (k=12), $ZrSiO_4$ (k=13), $Hf_{0.6}Si_{0.4}O_2$ (k of about 14, commonly referred to as HfSiO (40%)), combinations of these, and the like. Other examples of combinations of elemental oxides include $Zr_zHf_yO_x$, $Hf_zAl_yO_x$, and $Zr_zAl_yO_x$, where the ratio of z:y preferably is in the range of 1000:1 to 1:1000 and x satisfies stoichiometry. Some other materials under consideration as silicates or in combination with other metals are listed by "A Thermodynamic Approach to Selecting Alternative Gate Dielectrics," by D. G. Schlom, MRS Bulletin, 27 (3), 198-204, (2002).

High-k dielectric materials may be homogeneous (i.e., essentially pure) or heterogenous, i.e., used in combination with one or more other high-k and/or conventional dielectric materials. If heterogeneous, the materials may be intermixed, layered, and/or otherwise combined as desired. For example, one multilayer dielectric, gate structure of interest comprises three layers. A first layer typically positioned adjacent the silicon channel is formed from $SiO_2$. One or more high-k dielectric materials is used to form a middle dielectric layer. Finally, a top layer adjacent the gate electrode is formed from $SiO_2$.

The high-k films may be used in a wide variety of applications such as the fabrication of micro-electronic, micro-optical, liquid-crystal display (LCD) or micro-mechanical (MEMS) devices on any suitable substrate including, but not limited to substrates comprising Si, Ge, GaAs, SiC, $Si_3N_4$, $SiO_2$, combinations of these, and the like. For convenience, the group comprising any of these substrates will be referred to as "wafers". The present invention is usefully incorporated into one or more stages of manufacture in any such applications.

It has been observed that dilute fluoride containing species in aqueous solutions have different etch selectivities than more concentrated solutions. For example, it was observed that very dilute solutions of HF in water selectively etch the high-k films compared to TEOS and thermally grown oxides, particularly at elevated temperatures. That is, the high-k film etched faster than the TEOS reference film. TEOS was used as a reference film as it is commonly present on microelectronic devices.

The etch selectivity of an etching composition for a high-k film with respect to a co-existing film is determined by measuring the respective amounts of high-k film and reference film removed during identical exposures to an etching solution. The selectivity is then given by the ratio (thickness of high-k film removed):(thickness of reference film removed). Thus, stating the selectivity as "5:1" indicates that five times as much high-k film was removed as was reference film. The amount of film removed is typically measured by optical measurements such as ellipsometry. It is preferred that the solution etch the high-k material with a selectivity greater than about 1:1 with respect to a co-existing film, more preferably greater than about 3:1, and more preferably greater than about 5:1.

In the practice of the present invention, the selectivity of an etching solution for a high k material may be determined in some instances with reference to a TEOS film, inasmuch as TEOS is a conventional, common dielectric material in the microelectronic industry. Determining the etch selectivity of various high k dielectric materials with respect to the same kind of reference film also allows the etch selectivity for various materials to be more meaningfully compared to each other. For the purposes of the present invention, a TEOS reference film means an $SiO_2$ film deposited from a gaseous mixture that includes tetraethylorthosilicate. In the practice of the present invention, a TEOS reference film is made using the procedure described in "Silicon Processing for the VLSI Era, Volume 1—Process Technology" by Wolf et al., Lattice Press, 191-194, (2000).

The fact that sufficiently dilute, aqueous, fluoride containing solutions selectively etch high-k film(s) is very surprising. Commonly used concentrations of HF in water (0.49 wt % to 49 wt %) were tested at ambient and elevated temperatures and all etched the high-k materials much more slowly than TEOS. Yet, when the concentration of etchant is sufficiently dilute, selectivity is the opposite. The reason for the difference in etch selectivity between $SiO_2$ and high-k materials of solutions with very dilute fluoride containing species is not known. While not wishing to be bound by any theory, it is believed that the etching mechanism of $SiO_2$ differs from that of the high-k material such that dilute solutions etch high-k films more favorably.

For example, it is well known that many combinations of hydrogen and fluoride ions exist in aqueous solutions of HF. For instance, $H^+$, $F^-$, HF, $HF_2^-$ and $H_2F_2$ are believed to all be present in varying degrees. The absolute concentrations of these species is dependent upon factors including the total fluoride concentration (the sum of all fluoride containing species) and the pH of the solution ($H^+$ concentration) and other factors. $H_2F_2$ and $HF_2^-$ have been proposed as the dominant species involved in etching $SiO_2$ (Verhaverbeke 1994, Knotter 2000). Very dilute HF solutions favor $F^-$ as the primary fluorine species present in solution, with some HF but very little $HF_2^-$ or $H_2F_2$ being present. Consequently, if the etching mechanism of a high-k material proceeded via the $F^-$ ion or HF molecule, the relative etch rate of the high-k material should increase compared to that of $SiO_2$ as the solution becomes more dilute. The actual basis for the increase in selectivity with increasing dilution may be related to one or more of these effects, or to some other effect that has not been considered.

The preferred etching solution of the invention for carrying out precision etching comprises a fluoride containing species in an aqueous medium. The fluoride can be provided in one or more forms including $NH_4F$, HF, buffered HF (HF and $NH_4F$), KF, combinations thereof, and the like. HF is the preferred form. Many combinations of hydrogen and fluoride ions exist in aqueous solutions of HF; $H^+$, $F^-$, HF, $HF_2^-$ and $H_2F_2$ are all present in varying degrees. It is believed that polyatomic species such as $HF_2^-$ and $H_2F_2$ are dominant in concentrated HF solutions, while the monatomic species $F^-$ is relatively more dominant in very dilute solutions. The addition of other chemical species such as $NH_4OH$ allows the creation of other species in solution such as the buffering $NH_4F$ (which exists as $NH4^+$ (aq) and $F^-$ (aq) generally), which is generally considered to not take part in the etching process.

The fluoride concentration in the etching solution is sufficiently dilute to achieve the desired etch rate in a desired time period. If the etch rate is too high, the solution may be further diluted if desired. The fluoride concentration is preferably no greater than about 5 wt %, more preferably no more than about 0.2 wt %, even more preferably in the range of 0.0001 wt % to 0.2 wt %, even more preferably in the range of 0.001 wt % to 0.1 wt %, and most preferably in the range of 0.005 wt % to 0.05 wt %.

The pH of the etching solution has a strong effect on the etch rates of both high-k and $SiO_2$ containing films. Increasing the pH of the etching solution has been shown to generally slow the etch rates of the films. But with decreasing pH, the etch rate of the high-k material rose slightly while the etch rate of the $SiO_2$ fell. This is consistent with Knotter's (2001) findings that the etch rate of $SiO_2$ is not a simple function of pH.

It is possible to adjust the pH of the solution downward by the addition of an acid (e.g. HCl, $H_2SO_4$, $CH_3COOH$, combinations of these, etc.) and upward by the addition of a base (e.g. $NH_4OH$, KOH, $N(CH_3)_4OH$, etc.). For example, a solution of 0.05 wt % HF in water has a pH of approximately 2.4. The addition of 3.8 ml of 37% HCl per liter of HF solution shifts the pH downward to approximately 1.4. The addition of approximately 1.25 ml of 35 wt % $NH_4OH$ per liter of HF solution shifts the pH upward to approximately 3.4. In the present embodiments, the pH of the solution preferably is acidic and more preferably may be in the range of about 0 to about 2, alternatively about −1 to about 1, alternatively about 1 to about 3, alternatively about 3 to about 5, and alternatively about 5 to about 6.5.

Other ingredients can be added to the etching solution to accomplish other purposes in accordance with conventional practices as such practices are constituted from time to time. For instance, a surfactant such as 3,5-dimethylhexyne-3-ol can be added to reduce the surface tension of the solution and improve wetting of the films. Likewise, a chelating or complexing agent such as EDTA (ethylenediaminetetraacetic acid) can be added to bind metals in the solution and reduce metallic contamination remaining on the films or wafers after the etching process. In some cases, chelating and complexing agents themselves are effective in removing metal compounds. For instance, dilute solutions containing diammonium EDTA are used to remove calcium and other scale from equipment. Therefore, solutions of chelating or complexing agents may themselves be capable of etching high-k films, particularly with the addition of an acid or base to adjust the pH of the solution.

In some instances, hot water itself can etch silicon. It is believed that $O_2$ dissolved in the water may be implicated. Accordingly, it may be desirable to provide an etching solution in which the dissolved $O_2$ content is minimized and/or incorporate an appropriate amount of reducing agent such as $H_2$ into the solution. A typical supply of deionized water to be used in an etching solution may contain 0.1 to 10 ppm dissolved oxygen. To alleviate etching of unoxidized film, this may be reduced to a level of 0.05 ppm or less. Most commonly, a de-oxygenating treatment is applied to an aqueous fluid before adding fluoride containing species to the fluid, especially when the fluoride containing species is HF gas. Because HF is a gas, it would tend to at partially come out of solution in a typical degassification module. Methods of de-oxygenating are well known and any conventional technique, as such may be constituted from time to time, may be used. An example of one suitable de-oxygenating technique is described in the operating instructions for the Separel(tm) EFM-530 Degasification Module (Pall Corporation, East Hills, N.Y.).

In those embodiments in which a reducing agent is incorporated into an etching solution, an appropriate amount of reducing agent may be used based upon any suitable criteria as desired. One representative criteria is the effect of added reducing agent upon the oxidation-reduction potential (ORP) of the etching solution. For instance, enough reducing agent may be used to lower the oxidation-reduction potential of the solution to some threshold voltage, e.g., less than, for instance, 0.2 volts, above the oxidation-reduction potential of perfectly degassed water, measured at the pH of the etching solution.

The etching solutions of the present invention can be made in accordance with conventional practices as such are constituted from time to time that provides the desired composition. For instance, solutions of dilute HF in water can be made by mixing stock, concentrated HF with water. Solutions of dilute HF with adjusted pH can be created by the addition of other acids or bases to the aqueous HF mixture. Additionally, gaseous precursors can be dissolved in water to create one or more components of the solution (e.g., anhydrous HF, HCl or $NH_3$ gas). The fluoride ion species can also be provided in forms other than HF such as supplying F– from $NH_4F$ and adjusting the pH of the solution by the addition of HCl. The etching solution can be supplied premixed or as a concentrate from a commercial source. Or, the solution can be blended on-site and delivered to the process tool, blended on-demand in the process tool, or even created by blending any gaseous, liquid or solid precursors within the process chamber. Any combination of these techniques is also contemplated.

The etching process(es) and solution(s) can be used in any equipment where the etching solution is able to contact and etch the high-k material. For instance, the wafers with the high-k material can be immersed in a bath of the etching solution, either static, cascading or otherwise flowing, as in a wet bench. The wafers may be etched either singly or in groups. Likewise, the etching solution can be sprayed on a single wafer, as in a single-wafer spin processor, or on a group of wafers, as in a centrifugal spray processor (for example, the ZETA® or MERCURY® centrifugal spray processors from FSI International, Chaska, Minn.). The etching solution can also be made in-situ by the combination of HF gas and water in a single-wafer processor (for example, the EXCALIBUR® single-wafer processor from FSI International, Chaska, Minn.). Some of these equipment sets can couple acoustic energy preferably in the kilohertz or megahertz frequency range into the process liquids. This energy can cause a bulk motion of the liquid (acoustic streaming) that can increase the mass transfer rates in the solution. An increase in the mass transfer rate may result in an increase in the etch rate.

In the embodiments in which the etching solution is supplied as a flow, the flow rate(s) will tend to be selected based upon factors including the type(s) of equipment being used. Immersion baths can be static, but typically recirculate approximately 0.1 to 1 or more bath volumes per minute through a temperature control apparatus and a filter. Single-wafer spray processors typically flow approximately 0.5 lpm (liter per minute) to 2 lpm of process liquid, while batch spray processors typically flow from 1.5 lpm to 10 lpm of liquid solutions. For example, single-wafer processors blending HF gas and DI water (deionized, very pure water) in the process chamber might flow 1 lpm of water into the chamber along with e.g. 560 sccm of anhydrous HF gas, to create 0.05 wt % HF.

Temperature selection is based on many factors including desired etch rate and selectivity, and the hardware limitations of the etching equipment. Because the etch selectivity increases with increasing temperature, and the etch rates also increase with increasing temperature, more dilute and therefor less costly etching solutions can be used at elevated temperatures. Etching in conventional hardware with aqueous solutions is typically limited to temperatures below approximately 100° C., the boiling point of water. However, higher temperatures could be employed in a chamber pressurized above 1 atmosphere of pressure. At atmospheric pressures, the temperature of the etching solution may be at any suitable temperature such as at any temperature above 1° C., and more typically between 1° C. and 99° C.

The etch rates are controllable by varying the fluoride concentration, temperature and/or pH of the etching solution.

The principles of the present invention will now be described further with reference to the following illustrative examples:

EXAMPLE 1

300 mm bare silicon wafers were processed in a three-tank MAGELLAN®-style wet bench (as described in assignee's co-pending application U.S. Ser. No. 10/292,147, filed Nov. 12, 2002, titled REDUCED FOOTPRINT TOOL FOR AUTOMATED PROCESSING OF MICROELECTRONIC SUBSTRATES, in the names of Robert E. Larson et al., and having) to remove the native oxide, re-grow a 10 Angstrom chemical oxide, and then to uniformly etch back to 6 and 8 Angstrom oxide thicknesses. After the final etch, the wafers were rinsed and dried. In each run 3 wafers were positioned in slots 2, 26, and 51 with filler wafers making up the rest of the cassette. Oxide thickness and uniformity measurements were made on an ellipsometer commercially available from Rudolf Technologies, Inc., Flanders, N.J., and having model number 300. The measurements were determined by taking the average of 25 point measurements done sequentially. Three measurements were actually made at each point, with the average of the three measurements being deemed to be the measurement at that point.

This experiment was carried out to empirically determine the conditions by which 2 and 4 angstroms, respectively are etched. First the chemical oxide thickness that was grown with the ozonated water (DIO3). Oxide growth was done on 4 independent sets of wafers for the time periods noted in the following table. The following table lists the oxide thickness and uniformity with respect to time for each set. With chemical oxides there is a maximum thickness that can be achieved by increasing the time. In this case, the maximum thickness is 10.1 angstroms. However, the uniformity can be improved while processing for an additional period of time as shown by the better uniformity data achieved after 600 seconds as compared to 420 seconds. The DIO3 process was carried out with an ozone concentration of 80 ppm and at a flow rate of 20 LPM at room temperature (21° C.).

| DIO3 process time (sec.) | Average Oxide Thickness (Å) | Oxide Uniformity (% 1 sigma) | Range (Å) |
| --- | --- | --- | --- |
| 180 | 9.8 | 2.4 | 0.9 |
| 300 | 9.7 | 2.3 | 1.0 |
| 420 | 10.1 | 1.8 | 0.7 |
| 600 | 10.1 | 1.7 | 0.7 |

The next step involved etching the saturated oxide layers to empirically determine how long it would take to etch 2 angstroms and 4 angstroms, respectively, using the SYMFLOW™ TECHNOLOGY process at a concentration of 800:1 and at a flow rate of 40 LPM at room temperature. Since the etching of this chemical oxide film is not linear with respect to time, several tests were done to determine how long it would take to etch 2 and 4 Å. It was experimentally determined that to etch 2 Å required roughly 45 seconds and around 150 seconds to etch 4 Å. Although not used for this test, an etch control algorithm could be used to help make these times more precise by monitoring HF concentration, bath temperature, flow rate, and/or the like as inputs for a suitable control methodology such as feedback and/or feedforward control.

EXAMPLE 2

The following recipe was used to fabricate ultrathin, oxide layers with excellent uniformity characteristics, using 300 mm wafers and the MAGELLAN® style tool described above:

Place wafers into STG® tank filled with room temperature DI water;

A 250 second SYMFLOW™ TECHNOLOGY process using 200:1 HF at 40 LPM at room temperature to remove the native oxide. (This could also be a soak etch.)

A 300 second 40 LPM room temperature DI water rinse;

A 420 second DIO3 flow at 20 LPM with 80 ppm O3 concentration at room temperature;

A 300 second 40 LPM room temperature DI water rinse;

A 45 second SYMFLOW™ TECHNOLOGY process using 800:1 HF at 40 LPM at room temperature for a 2 Å etch or a 150 second SYMFLOW™ TECHNOLOGY process for a 4 Å etch;

A 300 second 40 LPM room temperature DI water rinse;

A STG® dry process using IPA;

Standard STG® dry sequence.

The following table lists the characteristics of the resulting 6 and 8 angstrom oxide films.

| | Process Slot | Ave.Oxide Thickness (Å) | Oxide Uniformity (% 1 sigma) | Range (Å) |
|---|---|---|---|---|
| 8 Å | 2 | 7.73 | 2.51 | 0.7 |
| | 26 | 7.85 | 1.40 | 0.3 |
| | 51 | 7.95 | 1.55 | 0.4 |
| 6 Å | 2 | 5.94 | 3.09 | 0.7 |
| | 26 | 6.01 | 2.48 | 0.5 |
| | 51 | 6.13 | 2.81 | 0.6 |

What is claimed is:

1. A method of making an oxide layer, comprising the steps of:
   a. cleaning a semiconductor substrate to provide a bare semiconductor surface;
   b. forming a substantially saturated or saturated oxide layer directly or indirectly on the bare semiconductor surface of a semiconductor substrate such that the substantially saturated or saturated oxide layer has a thickness in the range of from about 8 angstroms to about 20 angstroms, wherein the forming step comprises chemically growing a saturated or substantially saturated oxide on the semiconductor surface; and
   c. precision etching the thickness of the substantially saturated or saturated oxide layer in a uniform manner and by an amount in the range of from 0.5 angstrom to about 18 angstroms, wherein precision etching comprises the steps of:
      i. providing the semiconductor substrate having a saturated or substantially saturated oxide on the semiconductor surface in a bath of non-etching liquid;
      ii. introducing an etching chemical into the bath while at least partially enveloping the semiconductor substrate in eddy currents of the bath liquid and increasing the concentration of etching chemical in a non-step manner throughout the bath; and
      iii. introducing non-etching liquid into the bath resulting from step (c.ii) while at least partially enveloping the semiconductor substrate in eddy currents of the bath liquid and decreasing the concentration of etching chemical in a non-step manner throughout the bath.

2. The method of claim 1, wherein the eddy currents are generated by introducing etching chemical into the bath through a plurality of orifices as fluid streams.

3. The method of claim 2, wherein the fluid streams enter the bath liquid at a velocity of at least about 1,000 cm/mm.

4. The method of claim 2, wherein the fluid streams enter the bath liquid at a velocity of at least about 4,000 cm/mm.

5. The method of claim 2, wherein the fluid streams enter the bath liquid at a velocity of at least about 6,000 cm/mm.

6. The method of claim 1, wherein the eddy currents are generated by a mixing element selected from the group consisting of an impeller, pump, bubbler or a spray orifice.

7. The method of claim 1, wherein the non-etching liquid is water.

8. The method of claim 1, wherein the etched oxide layer has a uniformity of less than about +/−10%.

9. The method of claim 1, wherein the etched oxide layer has a uniformity of less than about +/−5%.

10. The method of claim 1, wherein the substantially saturated or saturated oxide layer has a thickness in the range of from about 8 angstroms to about 11 angstroms and the etched oxide layer has a thickness in the range from 2 angstroms to 8 angstroms.

11. The method of claim 1, further comprising the steps of:
    positioning the semiconductor substrate in a processing chamber; and
    performing the cleaning and forming steps while the semiconductor substrate is positioned in the processing chamber.

12. The method of claim 1, wherein the etched oxide layer has a uniformity in the range from +/−1 angstrom.

13. The method of claim 1, wherein the etched oxide layer has a uniformity in the range from +/−0.5 angstrom.

14. The method of claim 1, wherein the etched oxide layer has a uniformity in the range from +/−0.3 angstrom.

15. The method of claim 1, wherein chemically growing a saturated or substantially saturated oxide on the semiconductor surface comprises using ozonated water to chemically grow the saturated or substantially saturated oxide.

16. The method of claim 15, wherein precision etching the thickness of the substantially saturated or saturated oxide layer comprises using a fluorine-containing species in an aqueous medium to precisely etch the thickness of the substantially saturated or saturated oxide layer.

17. The method of claim 11, wherein the precision etching step is performed while the semiconductor substrate is positioned in the processing chamber.

* * * * *

UNITED STATES PATENT AND TRADEMARK OFFICE
CERTIFICATE OF CORRECTION

PATENT NO. : 7,235,495
APPLICATION NO. : 10/900912
DATED : June 26, 2007
INVENTOR(S) : Wagener Page 1 of 1

It is certified that error appears in the above-identified patent and that said Letters Patent is hereby corrected as shown below:

Column 5

Line 60, "out in" should be --out in a--.

Column 14

Line 21, "to at partially" should be --to partially--.
Line 27, "Separel(tm)" should be --SEPAREL$^{TM}$--.

Column 15

Line 57, "having)" should be --having Attorney Docket No. FSI0080/US)--.

Column 18

Line 2, "mm." should be --min.--
Line 4, "mm." should be --min.--
Line 6, "mm." should be --min.--

Signed and Sealed this

Thirteenth Day of May, 2008

JON W. DUDAS
*Director of the United States Patent and Trademark Office*